(12) United States Patent
Dick et al.

(10) Patent No.: US 7,882,799 B2
(45) Date of Patent: Feb. 8, 2011

(54) METHOD AND APPARATUS FOR GENERATING CHARGED PARTICLES FOR DEPOSITION ON A SURFACE

(75) Inventors: William Dick, Minneapolis, MN (US); Benjamin Y. H. Liu, North Oaks, MN (US)

(73) Assignee: MSP Corporation, Shoreview, MN (US)

( * ) Notice: Subject to any disclaimer, the term of this patent is extended or adjusted under 35 U.S.C. 154(b) by 1323 days.

(21) Appl. No.: 11/252,252

(22) Filed: Oct. 17, 2005

(65) Prior Publication Data

US 2006/0093737 A1    May 4, 2006

Related U.S. Application Data

(60) Provisional application No. 60/619,734, filed on Oct. 18, 2004.

(51) Int. Cl.
*B05B 5/00* (2006.01)
*B05B 5/025* (2006.01)
*B05C 19/00* (2006.01)

(52) U.S. Cl. .................. 118/621; 118/627; 118/308; 118/634; 239/690; 239/704; 239/708

(58) Field of Classification Search .............. 118/621, 118/623, 629, 308; 427/180, 475–486, 458; 239/690, 698, 704, 707, 708; 250/288; 435/285.2, 435/285.3
See application file for complete search history.

(56) References Cited

U.S. PATENT DOCUMENTS 5,194,297 A    3/1993    Scheer et al.
5,247,842 A *  9/1993    Kaufman et al. ........... 73/865.5

(Continued)

OTHER PUBLICATIONS

Liu, B.Y.H. et al., "Electrical Neutralization of Aerosols," J. Aerosol Science, 5:465-472 (1974).

(Continued)

*Primary Examiner*—Yewebdar T Tadesse
(74) *Attorney, Agent, or Firm*—Westman, Champlin & Kelly, P.A.; Z. Peter Sawicki

(57) ABSTRACT

A method for establishing a calibrating standard for wafer inspection includes depositing solid ionized particles of a known size range with an aerosol onto a wafer. The method also includes depositing particles onto a wafer in a deposition chamber by using an aerosol stream and the solid particles suspended in a gas; ionizing the aerosol stream with a negative or positive charge polarity or both by passing the aerosol stream through a non-radioactive ionizer to produce charged particles and supplying such aerosol stream to the deposition chamber. An apparatus for producing charged particles includes an atomizer and a non-radioactive ionizer in fluid communication with each other. The apparatus may also include an electrospray droplet generator for producing an aerosol with dry-solid particles and an ionizer that ionizes the molecules of the gas. The apparatus may also include a generator for generating an aerosol with particles suspended in the gas with a non-radioactive ionizer that ionizes the gas in the aerosol causing the aerosol particles to be charged. The apparatus may further include an electrostatic classifier for classifying the charged particles to a selected size range.

9 Claims, 3 Drawing Sheets

U.S. PATENT DOCUMENTS

Figure 1:
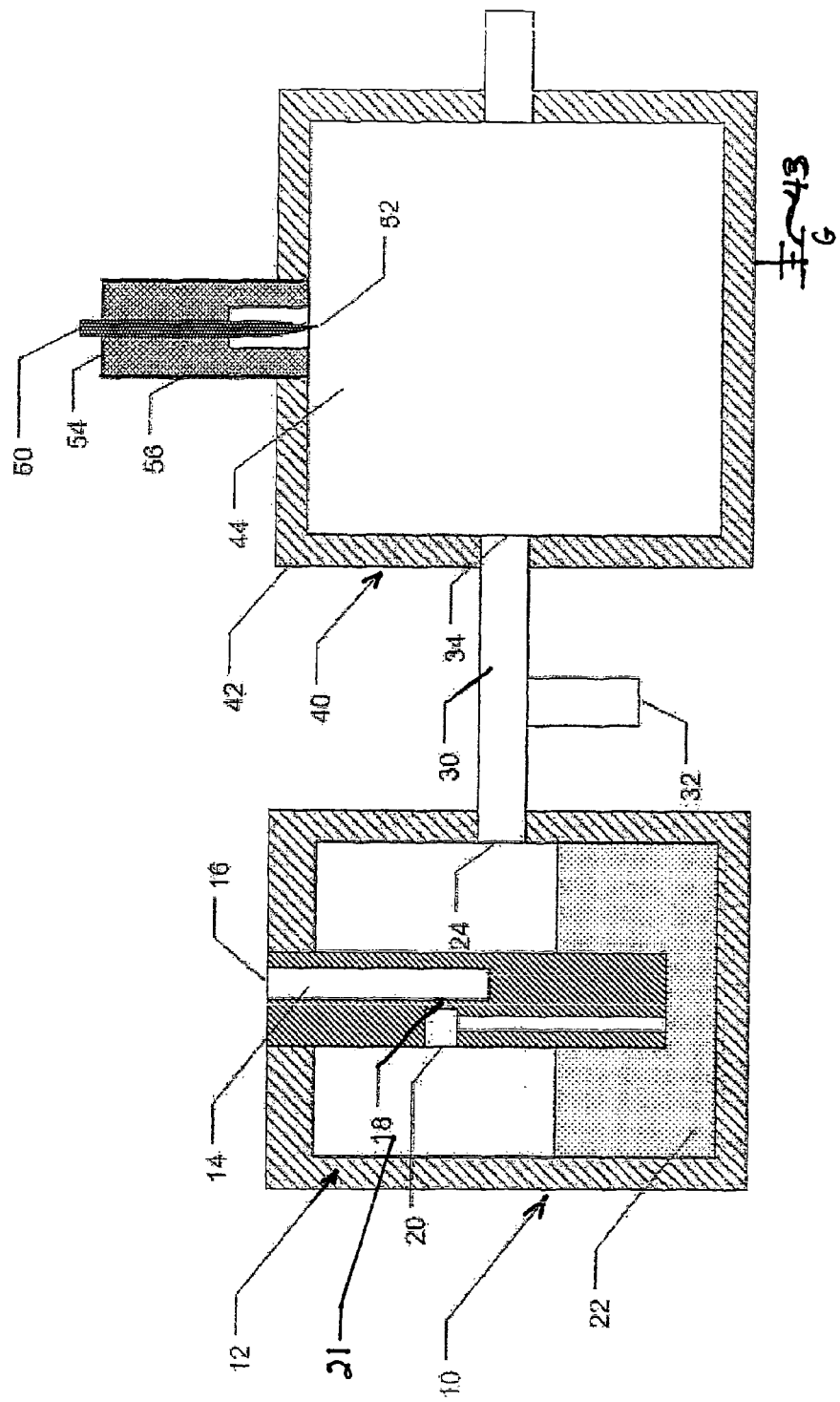

| | | |
|---|---|---|
| 5,306,345 A | 4/1994 | Pellet et al. |
| 5,316,579 A | 5/1994 | McMillan et al. |
| 5,534,309 A | 7/1996 | Liu |
| 5,916,640 A | 6/1999 | Liu et al. ............... 427/475 |
| 6,349,668 B1 * | 2/2002 | Sun et al. ............. 118/723 R |
| 6,544,484 B1 * | 4/2003 | Kaufman et al. ....... 422/186.04 |
| 6,607,597 B2 | 8/2003 | Sun et al. |
| 6,746,539 B2 | 6/2004 | Sun et al. |
| 2003/0070913 A1 * | 4/2003 | Miller et al. ............. 204/192.1 |

OTHER PUBLICATIONS

Liu, B.Y.H. et al., "Aerosol Charge Neutralization by a Radioactive Alpha Source," Particle Characterization, 3:111-116 (1986).

P. Kebarle et al., "On the Mechanism of Electrospray Mass Spectrometry," Chapter 1, Electrospray Ionization Mass Spectrometry, Richard B. Cole (Ed.), pp. 3-63, John Wiley and Sons (1997).

* cited by examiner

METHOD AND APPARATUS FOR GENERATING CHARGED PARTICLES FOR DEPOSITION ON A SURFACE

CROSS-REFERENCE TO RELATED APPLICATION

The present application is based on and claims the benefit of U.S. provisional patent application Ser. No. 60/619,734, filed Oct. 18, 2004, the content of which is hereby incorporated by reference in its entirety.

BACKGROUND OF THE INVENTION

This invention relates to methods and apparatus for generating charged particles for size measurement by electric mobility and deposition on a wafer and in particular relates to particle deposition for wafer inspection, surface cleaning and as seed nuclei in semiconductor device fabrication.

Solid particles of an accurately known particle size deposited on a wafer are useful as standards of calibration for wafer surface inspecting equipment. Solid particles deposited on a wafer can also be used as artificial contaminants for testing wafer cleaning tools to determine their efficiency for particle removal from the wafer surface. In addition, particles deposited on a wafer can be used as seed nuclei for subsequent processing to form unique thin films with desired physical or chemical properties.

Aerosols containing solid or liquid particles suspended in a gas medium are useful for a variety of purposes. When the aerosol particles are electrically charged, the particle size can be measured by measuring its electrical mobility in the gas medium. Charged particles in an aerosol can also be deposited on a semiconductor wafer as artificial contaminants for a variety of purposes.

One application relates to wafer surface inspection by laser light scattering, electron microscopy and other methods for detecting the presence of particles on the wafer surface and for measuring the particle size. Calibration of such surface inspecting tools requires depositing solid particles of an accurately known particle size on the wafer for use as calibration standards. For such applications, polystyrene latex (PSL) spheres are usually used. The PSL spheres are generally dispersed in an aqueous medium and atomized by a pressurized gas source to form droplets. The droplets are then evaporated to allow the individual PSL spheres to appear as solid, spherical particles of PSL suspended in the atomizing gas, thus forming a PSL aerosol. Aerosol refers to a gas containing suspended particles. PSL aerosol, therefore, refers to an aerosol in which the suspended particles are polystyrene latex spheres. The PSL spheres are then deposited from the aerosol onto the wafer surface to produce standard wafers for calibration purposes.

Deposition of small particles from an aerosol by the usual mechanisms of gravitational settling or diffusion is generally too slow and not suitable for practical applications. For most applications, the rate of deposition needs to be increased. This can be accomplished by using charged particles in combination with an electric field to cause increased rate of deposition by the application of an electrical force on the charged particles.

Aerosols produced by atomization usually are not highly charged. A common method to increase the particle charge is to expose the aerosol to a source of ionizing radiation from a radioactive material. The high energy nuclear particles of alpha, beta and gamma rays emitted by material undergoing radioactive decay ionize the molecules of the gas to form molecular ions of both a positive and a negative polarity. These molecular ions then collide with the aerosol particles suspended in the gas to cause the particles to become charged. The resulting particle charge is usually bipolar, meaning that some particles are positively charged, and some are negatively charge. Since roughly equal concentrations of positively and negatively charged particles are created, the aerosol remains substantially neutral even though the individual particles are charged. As a result, exposing an aerosol to a source of ionizing radiation from a radioactive material is often referred to as a neutralization process even though the end result also includes the production of charged particles of both a positive and a negative electrical polarity.

The most common radioactive material used for aerosol neutralization includes polonium 210 and krypton 85. Both of these materials are widely used. Polonium 210 is an alpha emitter with a half life of 138 days through radioactive decay, while krypton 85 is a beta emitter with a half life of 10.3 years. The use of radioactive ionizers for aerosol neutralization and aerosol particle charging are described in References 1 and 2.

Because of health, environmental and security concerns, radioactive materials for research, commercial or industrial use are generally regulated by appropriate governmental agencies. These regulations are becoming increasingly more stringent making the use of a radioactive ionizer a less desirable method for gas ionization and particle charging for wafer deposition and other applications. A non-radioactive alternative is therefore needed.

Another application relates to the generation and deposition of solid particles on a wafer for use as artificial contaminants for wafer cleaning studies. For such applications, the particles are generally deposited on a wafer. The wafer is then scanned by a scanning surface inspecting tool to determine the number of particles deposited. The wafer is then subjected to cleaning by the wafer cleaning tool. Following cleaning, the wafer is scanned again to provide a new particle count. The difference in the initial and final particle count is the number of particles removed by the wafer cleaning tool. The percent of particle removal is then referred to as a cleaning efficiency. Using wafers artificially contaminated by particles, the particle removal efficiency of cleaning tools can be easily measured.

For wafer cleaning studies, various particle materials need to be used. Particle materials of the greatest interest include silicon, silicon dioxide, silicon nitride, tungsten, and copper, among others. Dry solid particles of a variety of materials and sizes, therefore, need to be deposited on a wafer to produce test wafers for wafer cleaning studies. Since different particle materials have different adhesion force characteristics when deposited on the wafer surface, it is important that the material of particles used for testing the wafer cleaning tool be similar to the material of real contaminant particles found on the wafer.

Another application is the generation and deposition of solid or liquid particles on a wafer to serve as seed nuclei for subsequent wafer processing by chemical vapor deposition, atomic layer deposition, and other thin-film deposition processes for semiconductor integrated circuit device fabrication. Formation of thin film by various film formation processes is facilitated by the presence of seed nuclei for film formation and growth. For such applications, dry solid particles of the desired material can be deposited on a wafer. Alternatively, small liquid particles can be deposited on the wafer which can then be reacted chemically with another material or thermally processed to produce the desired solid seed nuclei for such applications.

In all of these applications, the number of particles deposited on the wafer is generally quite small, when compared to the number of particles needed to cover the wafer surface completely. As such, this application differs from other methods of droplet deposition for thin film fabrication such as those described in U.S. Pat. No. 5,316,579. For depositing droplets to form thin films, the number of droplets deposited must be sufficiently large to provide complete surface coverage to produce a continuous thin film on the surface for subsequent processing to form a solid thin film with the desired physical and/or chemical properties. For the present application, the number of particles deposited is small and the deposited particles remain as discrete entities on the wafer surface rather than as a continuous film on the wafer surface.

SUMMARY OF THE INVENTION

The present invention includes a method and apparatus for generating charged aerosol particles for size measurement by electrical mobility and deposition on a wafer. The method involves preparing an aqueous suspension of the solid particles and atomizing the liquid by a compressed gas atomizer to form a droplet aerosol. Following atomization, the droplets are evaporated to form an aerosol containing suspended solid particles in the gas. A non-radioactive ionizer is then used to increase gaseous ions in the aerosol for charging the particles. The non-radioactive ionizer is comprised of a high voltage corona discharge electrode connected to a source of DC or AC voltage. The corona discharge produces gaseous ions, which in turn collide with the particles to cause the particles to become electrically charged. In another aspect of the method, fine droplets containing suspended solid particles are atomized by an electrospray droplet generator. The droplets are then evaporated to form an aerosol comprised of solid particles suspended in a gas. The aerosol is then mixed with gaseous ions produced by a corona discharge to produce a suitable level of charge on the particles for subsequent size-classification by electrical mobility and deposition on a wafer. The present invention also includes a method of establishing a calibrating standard for wafer inspection by depositing solid ionized particles with an aerosol onto a wafer wherein the solid particles are of a known size range.

The present invention also includes a charged particle generating apparatus having an atomizer and a non-radioactive ionizer in fluid communication with each other. The present invention also includes a charged particle generating apparatus that includes an electrospray droplet generator that produces an aerosol containing dry-solid particles and a non-radioactive ionizer in fluid communication with each other. The present invention also includes an apparatus for producing a charged monodispersed aerosol that includes a charged particle generator containing a non-radioactive ionizer, and electrostatic classifier.

The present invention also includes an apparatus for providing charged particles for deposition on a substrate wherein the apparatus comprises a generator for generating an aerosol with particles suspended in the gas and a non-radioactive ionizer that ionizes the gas in the aerosol to provide ions of a positive or negative charge polarity or both in the gas causing the aerosol particles to be charged in a fashion suitable for deposition on a substrate. The apparatus may also include an electrospray droplet generator producing an aerosol with dry-solid particles suspended in a gas; an ionizer that ionizes the molecules of the gas to provide ions of a positive or a negative charge or both in the gas; and a mechanism that mixes the ionized gas with the aerosol to provide charged particles in a fashion suitable for deposition on the subtrate.

BRIEF DESCRIPTION OF THE DRAWINGS

FIG. 1 is a schematic view of a charged particle generating apparatus comprised of a compressed gas atomizer and a high voltage corona ionizer FIG. 2 is a schematic view of a charged particle generating apparatus comprised of an electrospray droplet generator and a high voltage corona ionizer placed in the same housing.

FIG. 3 is a schematic view of a charged particle generator combined with an electrostatic classifier and a deposition chamber for particle deposition on a wafer surface.

DETAILED DESCRIPTION OF THE INVENTION

FIG. 1 is a schematic diagram of an apparatus for generating charged particles by the process of atomization combined with charging by a high-voltage corona ionizer. An atomizer, shown generally at 10, includes a reservoir 12 containing a liquid 22 to be atomized. A gas flow passageway 14 allows a compressed gas to be introduced through the inlet 16 to a restricting orifice 18 to form a high velocity gas jet. The high velocity gas jet causes suction, i.e. a vacuum, to be generated in the exit gas flow passageway 20. As a result, liquid in the reservoir 12 is aspirated into this low pressure, vacuum region. In this region, the high velocity gas jet causes the liquid 22 to be atomized to form droplets. This droplet aerosol then flows out of the gas flow passageway 20 into the space 21 above the liquid 22 in the reservoir 12.

To the right of the atomizer is a gas-flow passageway 30 with an inlet 24 on the left and an outlet 34 on the right. Between the inlet 24 and the outlet 34 is a second gas inlet 32 through which additional gas can be introduced to mix with the aerosol and facilitate droplet evaporation. When water is atomized, a dry gas is introduced through inlet 32 in order to lower the relative humidity of the mixture flowing out of the outlet 34. By this means the droplets are evaporated before entering the charging chamber containing the high-voltage corona ionizer.

To produce an aerosol comprised of dry-solid particles suspended in a gas the particles, such as polystyrene latex (PSL) spheres, are first dispersed in water, which is then placed in the reservoir 12 for atomization. The atomized droplets are then evaporated to leave behind solid PSL spheres suspended in the gas to form a PSL aerosol.

As mentioned earlier, solid and/or liquid particles produced by atomization usually are not highly charged. The charge is generally too low for most applications in which particles are deposited from an aerosol onto a surface. To produce a higher level of particle charge, the non-radioactive ionizer 40 is used. The non-radioactive ionizer 40 includes a housing 42 with an internal cavity 44. The housing 40 also includes a metal electrode 50 surrounded by electrical insulation 54, which is in turn surrounded by metal 56 as a shield. The electrode 50 is connected to a source of high voltage (not shown). The insulation 54 minimizes current leakage that may otherwise occur from the high voltage electrode 52 to the housing 42 which is grounded 43.

The metal electrode 50 has a sharp tip 52 on its end. When a high voltage on the order of a few thousand volts is applied to the electrode, a high electric field gradient is established in the immediate vicinity of the tip 52 causing the gas to breakdown to produce molecular ions by the process known as corona discharge. The ions can be unipolar, i.e. all of the same polarity, if the applied voltage is DC. If an AC voltage is applied, bipolar ions are produced. For purposes of generating charged aerosol particles for deposition on a wafer, either a DC or an AC voltage can be used. The resulting aerosol particle charge can be unipolar, i.e. all of the same electrical polarity; or bipolar with some particles carrying a positive polarity of charge, and some a negative polarity. Another method of producing charged particles for subsequent deposition on a wafer is to use a process known as electrospray. The electrospray droplet generation process is widely used to generate molecular ions for Electrospray Ionization Mass Spectrometry P. Kebarle and Yeunghaw Ho., "On the Mechanism of Electrospray Mass Spectrometry", Chapter 1, *Electrospray Ionization Mass Spectrometry*, Richard B. Cole (Ed.), pp. 3-63, John Wiley and Sons (1997)(which is herein incorporated by reference in its entirety). Electrospray involves spraying a liquid through a fine capillary held at a high voltage to generate highly charged droplets, which are then evaporated to produce molecular ions as an ion source for mass spectrometry. In the present invention, the electrospray is used as a fine droplet generator to generate particles for deposition on a wafer.

Figure 2:
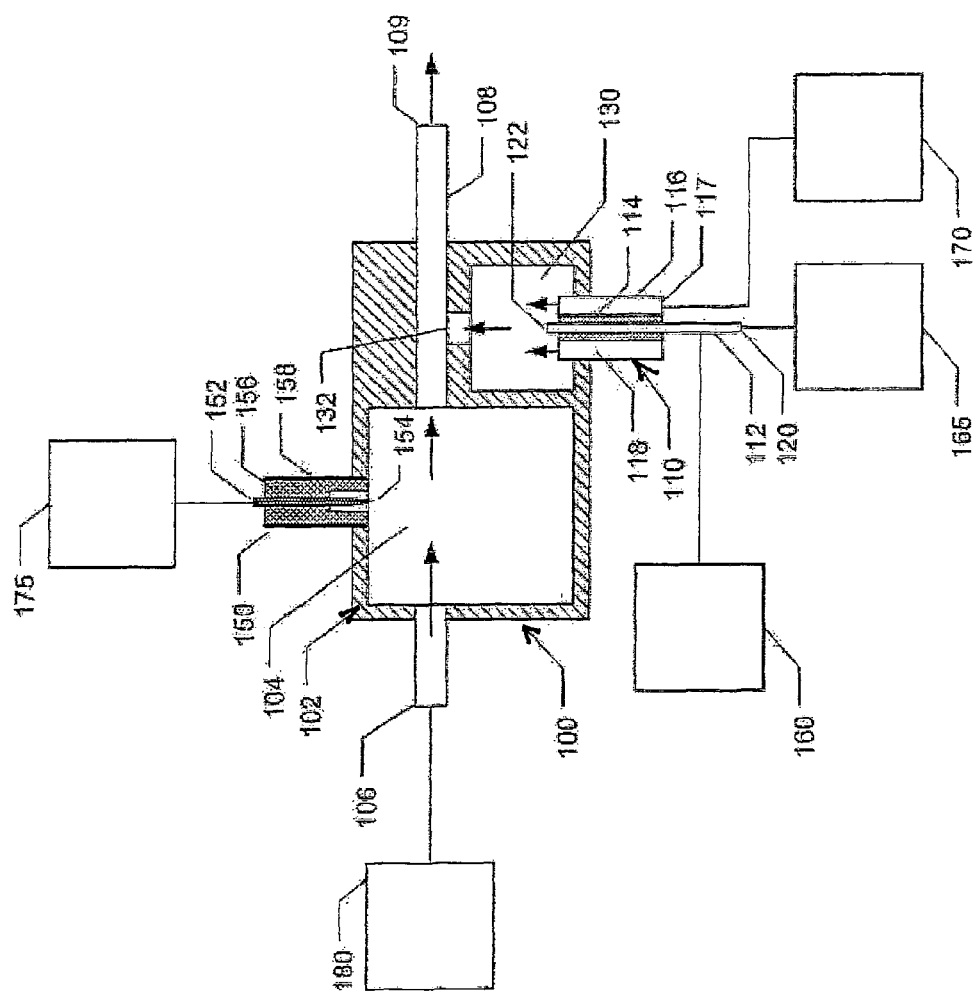

In FIG. 2, the electrospray charged droplet generating apparatus is shown generally at 100. The apparatus has a housing 102 with two interior cavities 104 and 130. The housing is provided with two gas inlets 106 and 116 and a gas outlet 109.

The electrospray droplet generating apparatus itself is shown generally at 110. the apparatus 110 includes a fine capillary 112 surrounded by electrical insulation 114 which in turn is surrounded by a metal tube 116. The insulation 114 is spaced apart from tube 116 to provide an annular space 118 in between. The capillary 112 has an inlet 120 to allow a liquid to be introduced and an outlet 122 through which the liquid can exit. Both the liquid and the capillary are connected to a source of high voltage 160. The liquid source is shown as 165, which contains solid particles, such as PSL spheres, suspended in a liquid, such as water. As the liquid enters the inlet 120, the liquid encounters a high electric field gradient in the immediate vicinity of the capillary. This high field gradient causes the liquid to accelerate. As the liquid velocity increases, the cross-sectional area of flow will decrease. As a result, the liquid emerging from the capillary will form a conical shaped column with a large cross-sectional area at the base and tapering to a fine tip at the top. This conical shaped liquid column is commonly referred to as a Taylor cone. At the tip of the Taylor cone, the liquid is sprayed out to produce highly charged and very fine droplets in the electrospray chamber 130.

Since the electrospray will only operate properly if the gas surrounding the Taylor cone does not break down to produce a corona discharge, a gas, such as $CO_2$, that does not breakdown easily can be introduced through the annular gap space 118 between the insulation and the outer tube and fill the chamber 130 with $CO_2$. Other gases that are not-easily ionizable, such as argon, helium, etc. can also be used. The gas source is shown at 170, which is connected to the annular space through the inlet 116.

A voltage ionizer 150 similar to the one described with reference to FIG. 1 is located upstream of the electrospray atomizer 110. The high voltage ionizer 150 includes a metal electrode 152 with a sharp tip 154 on one end. The electrode 152 is surrounded by electrical insulation 156, which is in turn surrounded by a metal sheath 158. The electrode 152 is connected to a source of high voltage 175, which can be either DC or AC. When DC high voltage is used, the polarity of the voltage must be opposite to the polarity of the voltage applied to the electrospray capillary 120 so that gaseous ions generated by the high voltage will have a polarity that is opposite to that of the charged droplets produced by the electrospray. The high-voltage ionizer includes the interior cavity 104 in which the gaseous ions are produced. The cavity 104 is connected to a gas source 180 supplying a gas flow through the inlet 106 to the cavity 104. This gas flow then carries the gaseous ions and flow through the tube 108 where the gas is mixed with the electrosprayed particles flowing through the orifice 132 from the chamber 130. The electrospray chamber 130 is supplied with a source of dry gas 170 so that the droplets are evaporated in the chamber 130 to produce an aerosol containing dry solid particles suspended in the gas. By this means the particle charge is quickly reduced as the particles collide with ions of the opposite polarity in the gas. The resulting particle charge can be unipolar or bipolar depending on the operating conditions of the high-voltage corona ionizer and the electrospray particle generator. When the applied voltage on the electrode 152 is AC, gaseous ions of both polarities are produced. These gaseous ions would then collide with the particles to form an aerosol carrying charged particles of both polarities. The charged particles can then be deposited by applying an electric field on the wafer as previously described.

In other types of electrospray particle generating apparatus such as that described in U.S. Pat. No. 5,247,842 the electrosprayed droplets are evaporated and neutralized by bipolar ions at the same time. The present invention makes use of a dry gas source 170. The electrosprayed droplets are thoroughly evaporated in the spray chamber 130 leaving suspended in the gas only dry solid charged particles. It is this aerosol containing dry suspended solid particles carrying a high electrical charge that is mixed with the ionized gas flowing through 180 to have the particle charge neutralized or substantially reduced. Aerosols generated by compressed gas atomizers are usually not of a uniform size and are referred to as polydisperse. For many applications, it is desirable to use particles that are monodisperse, i.e. of a uniform size. A method of classifying the particles according to size must be used as part of the apparatus to produce monodisperse particles for deposition on a wafer.

FIG. 3 shows an apparatus for producing a monodisperse aerosol by electrostatic classification. The charged particle generator shown at 180 can be either the charged particle generator illustrated in FIG. 1 or in FIG. 2. The apparatus shown generally at 200 is referred to as an electrostatic classifier, which is also known as a differential mobility analyzer. The apparatus 200 is of a generally cylindrical shape and comprises a inner cylindrical electrode 214 surrounded by the cylinder 212, which is in turn partially surrounded by tube 210. The spacing between the inner cylinder electrode 214 and the cylinder 212 and the spacing between the cylinder 212 and the rod 24 form annular gas flow passageways, 220 and 222, respectively.

The apparatus 200 is provided with two gas inlets, 202 and 204 on top portion 205 and two gas outlets, 206 and 208 on a bottom portion 207. The aerosol carrying charged particles produced by the charged particle generator 180 is introduced into the apparatus 200 through the inlet 202, while a clean gas that does not contain particles is introduced into the apparatus through inlet 204. These gas streams then flow down their respective flow passageways in the annular space 220 and 222 near the top portion 205.

The cylinder 212 has a circumferential slit 224 to allow the aerosol to flow from the annular space 220 into the annular space 222. Upon entering the annular space 222, the aerosol stream joins the clean gas stream to flow down the annular space 222 in the general direction of arrows 225. The apparatus 200 is designed such that the gas flow in the annular space 222 is laminar and there is no intermixing of the aerosol and clean gas streams. As a result, both streams flow down the annular space 222 as laminar streams with the clean gas stream forming a clean gas sheath between the aerosol stream and the inner cylindrical electrode 214.

The inner cylindrical electrode 214 is connected to a source of high DC voltage while the outer tube 210 and cylinder 212 are grounded. The electrode 214 thus forms a high voltage electrode which is insulated from the ground by insulator 216. The applied high voltage establishes a radial electric field in the annular space 222. As the aerosol flows down the annular space 222, the particles, which are electrically charged, are acted upon by this radial electric field and migrate in a radial direction. If the particle charge is of the same polarity as the DC voltage on the cylindrical electrode 214, the particles are repelled by the electrode voltage and thus will migrate toward the cylinder 212 and be deposited on the inner surface of the cylinder 212. In contrast, particles carrying an opposite polarity charge as the voltage on the cylindrical electrode 214 are attracted by the electrode 214 and will migrate through the clean sheath flow toward the cylinder 214.

A slit 226 is positioned near the bottom of the cylindrical electrode 214. A small amount of gas is allowed to flow through this slit and exit the apparatus through exit 208. The gas exiting through exit 208 contains particles that have migrated through the laminar gas streams in the annular space 222 to the vicinity immediately outside the slit. These particles are of a certain electrical mobility and size depending on the geometrical dimensions of the apparatus, the aerosol and clean gas flow rates, and the applied DC voltage on the cylindrical electrode 214. For a specific DC voltage applied to the electrode 214, particles with a smaller size and a higher electrical mobility will migrate through the radial distance at a higher speed, and thus be collected on the surface of the cylindrical electrode 214 above the slit. Those with a larger particle size and a lower electrical mobility will migrate at a slower speed. The larger particles with lower electrical mobility would be deposited on the surface of the high voltage electrode 214 below the slit or be carried away by the main gas stream and exit the apparatus through the exit 206. By this means, a polydisperse aerosol introduced into the apparatus 200 through the inlet 202 will appear as a monodisperse aerosol at the exit 208. The device thus functions as a classifier of particle size, and will be referred to herein as an electrostatic classifier. The electrostatic classifier thus classifies a polydisperse aerosol into a monodisperse aerosol of a narrow size range at the exit 208.

Particles in this monodisperse aerosol are electrically charged and can be introduced into an apparatus for deposition on a wafer. A deposition apparatus 300 useful for the present invention includes a housing 302 forming a chamber 303 in which a wafer 320 is held. Charged aerosol enters the chamber 303 through an inlet 312 in a deposition head 310. As the aerosol flows out of deposition nozzle 314 on the deposition head 310, the aerosol impinges on the wafer surface. Both the chamber 303 and the deposition head 310 are electrically grounded, while the wafer is held at a high DC voltage by a high voltage DC source (not shown). The DC voltage has a polarity that is opposite to the polarity of charge on the particles. For instance, when an aerosol containing negatively charged particles is used, the polarity of charge on the wafer would be positive. By this means the charged particles are deposited on the wafer with an increased rate of deposition due to electrostatic attraction between the wafer and the charged particles.

Figure 3:
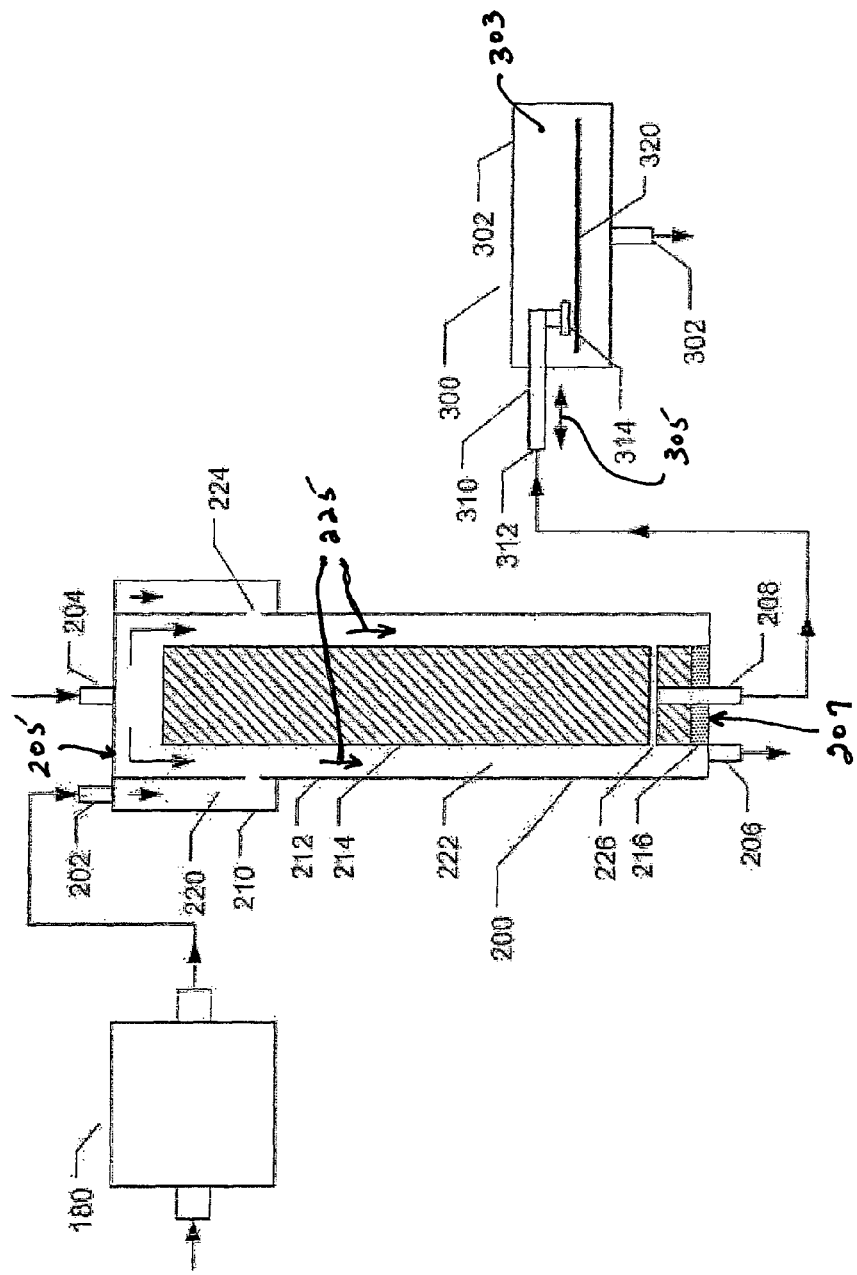

The deposition head 310 can be moved in and out of the chamber 303 as indicated by arrows 305 in FIG. 3. The deposition nozzle 314 can thus be moved along a radial direction with respect to the wafer and to a specific radial position from the center of the wafer. Similarly, the wafer can be rotated around an axis perpendicular to the wafer by a mechanism (not shown). By this means particles can be deposited at various angular and radial locations on the wafer. Many spots of particles can be deposited on a wafer by simply moving the deposition nozzle to a specific radial location and rotating the wafer to a specific angular location, and then depositing the particles on the wafer at that location for a certain period of time until the required number of particles is deposited. The method and apparatus for deposition charged particles on a wafer by the use of an electrostatic classifier and a movable deposition head in a chamber are described in U.S. Pat. Nos. 5,534,309, 6,607,597B2 and 6,746,539B2 which are herein incorporated by reference.

Although the present invention has been described with reference to preferred embodiments, workers skilled in the art will recognize that changes may be made in form and detail without departing from the spirit and scope of the invention.

The invention claimed is:

1. A charged particle generating apparatus including an atomizer for producing an aerosol and a non-radioactive ionizer downstream and in fluid communication with the atomizer, the non-radioactive ionizer having sufficient voltage and configured to produce ionization directly in the aerosol without dilution resulting in charged particles.

2. A charged particle generating apparatus including an electrospray droplet generator configured to produce charged particles in a first gas containing dry-solid particles carrying a charge and a non-radioactive ionizer in fluid communication with each other, the non-radioactive ionizer configured to produce positive and negative ions in a second undiluted gas different than the first gas sufficient to reduce the particle charge to a level lower than the first gas.

3. An apparatus for producing a charged monodisperse aerosol including a charged particle generator containing a non-radioactive ionizer, and an electrostatic classifier, the charged particle generation being configured to produce an undiluted charged particle stream to the electrostatic classifier.

4. An apparatus for providing charged particles for deposition on a substrate, the apparatus comprising:
   an electrospray generator for generating an aerosol with dry solid particles suspended in a gas;
   a non-radioactive ionizer configured to ionize the gas in the aerosol to provide ions of a positive and a negative charge polarity in the gas causing the dry solid particles in the aerosol to be charged in a fashion suitable for depositing on the substrate; and
   a deposition chamber in which the dry solid particles in the aerosol are deposited onto the substrate.

5. The apparatus of claim 4 and further comprising a particle classifier for classifying particles in the aerosol in a selected size range before deposition on the substrate.

6. The apparatus of claim 4 wherein the non-radioactive ionizer is a corona ionizer operating with an AC high voltage.

7. An apparatus for providing charged particles for deposition on a substrate, the apparatus comprising:
   an electrospray droplet generator for producing an aerosol with dry-solid particles suspended in a first gas;
   an ionizer that ionizes the molecules of the gas configured to provide ions of a positive and negative charge in a second undiluted gas different from the first gas; and
   a mechanism that mixes the ionized gas with the aerosol to provide charged particles in a fashion suitable for depositing on the substrate.

8. The apparatus of claim 7 wherein the ionizer is a non-radioactive type ionizer.

9. The apparatus of claim 8 wherein the ionizer is a corona ionizer.

* * * * *